US011088560B2

(12) United States Patent
Hsu et al.

(10) Patent No.: US 11,088,560 B2
(45) Date of Patent: Aug. 10, 2021

(54) CHARGER HAVING FAST TRANSIENT RESPONSE AND CONTROL METHOD THEREOF

(71) Applicant: ANPEC ELECTRONICS CORPORATION, Hsinchu (TW)

(72) Inventors: Chun-Kai Hsu, Hsinchu (TW); Chih-Ning Chen, Taipei (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 572 days.

(21) Appl. No.: 16/049,753

(22) Filed: Jul. 30, 2018

(65) Prior Publication Data
US 2019/0305566 A1 Oct. 3, 2019

(30) Foreign Application Priority Data

Apr. 3, 2018 (TW) ................................. 107111899

(51) Int. Cl.
*H02J 7/00* (2006.01)
*H03K 4/48* (2006.01)
*H03K 5/24* (2006.01)
*H02M 3/158* (2006.01)
*H02J 7/02* (2016.01)

(52) U.S. Cl.
CPC .............. *H02J 7/008* (2013.01); *H02M 3/158* (2013.01); *H03K 4/48* (2013.01); *H03K 5/24* (2013.01); *H02J 7/02* (2013.01); *H02J 2207/20* (2020.01)

(58) Field of Classification Search
CPC .......... H02J 7/02; H02J 7/008; H02J 2207/20; H03K 4/48; H03K 5/24; H02M 1/08; H02M 3/158
See application file for complete search history.

(56) References Cited

U.S. PATENT DOCUMENTS

| 2006/0232241 A1* | 10/2006 | Lu ........................... H02J 7/045 320/125 |
| 2006/0267553 A1* | 11/2006 | Chuang ..................... H02J 7/02 320/128 |
| 2016/0079851 A1* | 3/2016 | Babazadeh ........... H02M 3/158 323/271 |

* cited by examiner

Primary Examiner — Richard Isla
Assistant Examiner — Johali A Torres Ruiz
(74) Attorney, Agent, or Firm — Li & Cai Intellectual Property (USA) Office

(57) ABSTRACT

A charger having a fast transient response and a control method thereof are provided, which decide how to quickly respond to a requirement of a load by determining whether an input current reference signal indicating an input current is larger than or equal to a maximum safe current of a transformer. Therefore, the charger and the control method realize the fast transient response without having to control switching between a boost circuit and a buck circuit. Meanwhile, the charger and the control method thereof can be prevented from being damaged by an excessive input current and can stabilize an output voltage of the load more quickly.

10 Claims, 9 Drawing Sheets

CHARGER HAVING FAST TRANSIENT RESPONSE AND CONTROL METHOD THEREOF

BACKGROUND

1. Technical Field

The present disclosure involves to a charger and a control method thereof, and more particularly to a charger having a fast transient response and a control method thereof.

2. Description of Related Art

Portable electronic devices such as mobile phones, tablet computers, music players, or video players, etc. have become an indispensable part of people's daily lives. Since power of the portable electronic devices is consumed very quickly, a user usually carries a charger such as a mobile power source to charge the portable electronic devices. The charger generally supports On The Go (OTG) specification. That is, the charger may be used as a peripheral device and receive energy from other devices such as a desktop computer. Alternatively, the charger may be used as a master and charge slave electronic devices. Furthermore, in recent years, a charger which can supply an electric power to slave electronic devices while being charged by a commercial power has been developed.

The above charger usually has a buck circuit and a boost circuit. When the charger intends to charge an internal battery, the charger is switched to the buck circuit for bucking the commercial power to an appropriate voltage. On the other hand, when the charger intends to charge the electronic devices, the charger is switched to the boost circuit for boosting a voltage supplied by the internal battery to an appropriate voltage. That is, the conventional charger achieves its function by one buck circuit and one boost circuit.

The operating principle of the conventional charger is described as follows. A maximum current which a transformer of the conventional charger can supply is 1 A after receiving the commercial power, but a current required by the electronic device is 1.5 A. In other words, the energy supplied by the transformer is insufficient to satisfy the energy requirement of the electronic device. At this time, the charger is switched to the boost circuit such that the battery starts to supply energy to the electronic device to meet the requirement of the electronic device. In short, in addition to the current of 1 A supplied by the transformer, the battery further supplies a current of 0.5 A, such that the electronic device receives the current of 1.5 A.

However, the conventional charger has some disadvantages, one of which is that the battery can only supply a fixed amount of current. For example, as the load of the electronic device drops, the electronic device only needs a current of 1.2 A. At this time, the battery still supplies the current of 0.5 A to the electronic device, so that the transformer only needs to supply a current of 0.7 A to the electronic device. As an output current of the transformer becomes smaller, the controller of the conventional charger determines that the transformer alone is enough to meet the requirement of the electronic device. Then, the controller turns off the boost circuit and switches to the buck circuit to charge the battery. However, the conventional charger will be switched to the boost circuit again such that the battery outputs energy again since the transformer cannot supply sufficient energy for the electronic device. In short, the conventional charger is constantly switched between the boost circuit and the buck circuit, so that it cannot stably operate and supply energy to the electronic device.

Another disadvantage of the conventional charger is slow reaction time. The conventional charger spends more time generating a control signal to control switching between the buck circuit and the boost circuit. That is, the conventional charger spends more time on calculating and generating the control signal so that the conventional charger fails to immediately respond to a request from the electronic device, thereby resulting in voltage drop of the electronic device.

SUMMARY

The present disclosure provides a charger having a fast transient response and a control method thereof, which do not need a boost circuit and a buck circuit of a conventional charger. In contrast, the conventional charger requires more time to generate a control signal to control switching between the boost circuit and the buck circuit, but the charger and the control method thereof of the embodiments of the present invention can quickly respond to the load requirement without switching between different circuits.

The embodiment of the present invention provides a charger having a fast transient response. The charger includes a transformer, a current detector, a power stage circuit, a feedback compensation circuit, a ramp circuit and a control circuit. The transformer is configured to supply an input current. The current detector is coupled to the transformer and configured to detect the input current to generate an input current reference signal indicating the input current. The power stage circuit has one terminal coupled to the transformer and a load and another terminal coupled to an energy storage element. The feedback compensation circuit is coupled between the current detector and the power stage circuit, the power stage circuit is configured to detect a charging current and a charging voltage of the energy storage element, and the feedback compensation circuit is configured to generate an amplified error signal according to the charging current, the charging voltage and the input current reference signal. The ramp circuit is coupled to the current detector and configured to generate a ramp signal. The control circuit is coupled between the ramp circuit, the feedback compensation circuit and the power stage circuit, and the control circuit is configured to control the power stage circuit according to the ramp signal and the amplified error signal. When the input current reference signal is larger than or equal to a maximum safe current of the transformer, the ramp circuit raises the ramp signal or the feedback compensation circuit reduces the amplified error signal, the control circuit accordingly controls the power stage circuit to stop the input current charging the energy storage element and starts the energy storage element to charge the load through the power stage circuit. When the input current reference signal is smaller than the maximum safe current, the ramp signal and the amplified error signal are not adjusted by the ramp circuit and the feedback compensation circuit respectively, and the control circuit accordingly controls the power stage circuit to transmit the input current to the load and the energy storage element.

The embodiment of the present invention provides a method of controlling charger. The charger is coupled to a load, the control method includes: supplying an input current by a transformer; detecting the input current to generate an input current reference signal indicating the input current; detecting a charging current and a charging voltage of an energy storage element, generating an amplified error signal according to the charging current, the charging voltage, and the input current reference signal; and determining whether the input current reference signal is larger than or equal to a maximum safe current of the transformer. When the input current reference signal is larger than or equal to the maximum safe current, a ramp signal is raised or the amplified error signal is reduced, the input current is stopped from charging the energy storage element, and the energy storage element is controlled to start charging the load according to a raised ramp signal and the amplified error signal, or according to the ramp signal and the reduced amplified error signal. When the input current reference signal is smaller than the maximum safe current, the input current is transmitted to the load and the energy storage element according to the ramp signal and the amplified error signal that are not adjusted.

In summary, the embodiments of the present invention provides the charger having the fast transient response and the control method thereof, which decide how to quickly respond to the load requirement by determining whether the input current reference signal indicating the input current is larger than or equal to the maximum safe current of the transformer. Therefore, the charger and the control method of those embodiments realize the fast transient response without having to control switching between the boost circuit and the buck circuit. Meanwhile, the charger and the control method thereof can be prevented from being damaged by the excessive current input and can stabilize the output voltage of the load more quickly.

For better understanding of the features and technical content of the present invention, the following detailed description is illustrated with reference to the accompanying drawings of the present invention. It should be noted that the description and the accompanying drawings are only used to illustrate the present invention, but not intends to limit the present invention.

DESCRIPTION OF THE EXEMPLARY EMBODIMENTS

The exemplary embodiments will be described below in more detail with reference to the accompanying drawings.

The inventive concepts may be embodied in many different forms and should not be construed as being limited to the exemplary embodiments set forth herein. Like reference numbers refer to like elements throughout.

It should be understood that, although the terms "first", "second", "third", and the like may be used herein to describe various elements or signals, these elements or signals should not be limited by these terms. These terms are only used to distinguish one element from another element or one signal from another signal. As used herein, the term "or" includes any one of and one or more combinations of the associated listed items.

The embodiments of the present invention provides a charger having a fast transient response and a control method thereof, which decide how to quickly respond to a load requirement by determining whether an input current reference signal indicating an input current is larger than or equal to a maximum safe current of a transformer. Further, when the input current reference signal is larger than or equal to the maximum safe current of the transformer, a ramp signal is raised or an amplified error signal is reduced, and the input current is stopped to charge an energy storage element and the energy storage element is started to charge a load according to an adjusted signal. When the input current reference signal is smaller than the maximum safe current, the ramp signal and the amplified error signal are not adjusted, and the input current is transmitted to the load and the energy storage element according to the ramp signal and the amplified error signal.

Therefore, the charger and the control method thereof of the present invention can quickly respond to a current requirement of the load without having to control switching between a boost circuit and a buck circuit. In addition, raising the ramp signal or reducing the amplified error signal allows the energy storage element to supply a larger charging current to the load more quickly, thereby avoiding the charger from being damaged by an excessive input current and stabilizing the output voltage of the load more quickly. The charger having the fast transient response and the control method thereof of the present invention are further described below.

Figure 1:
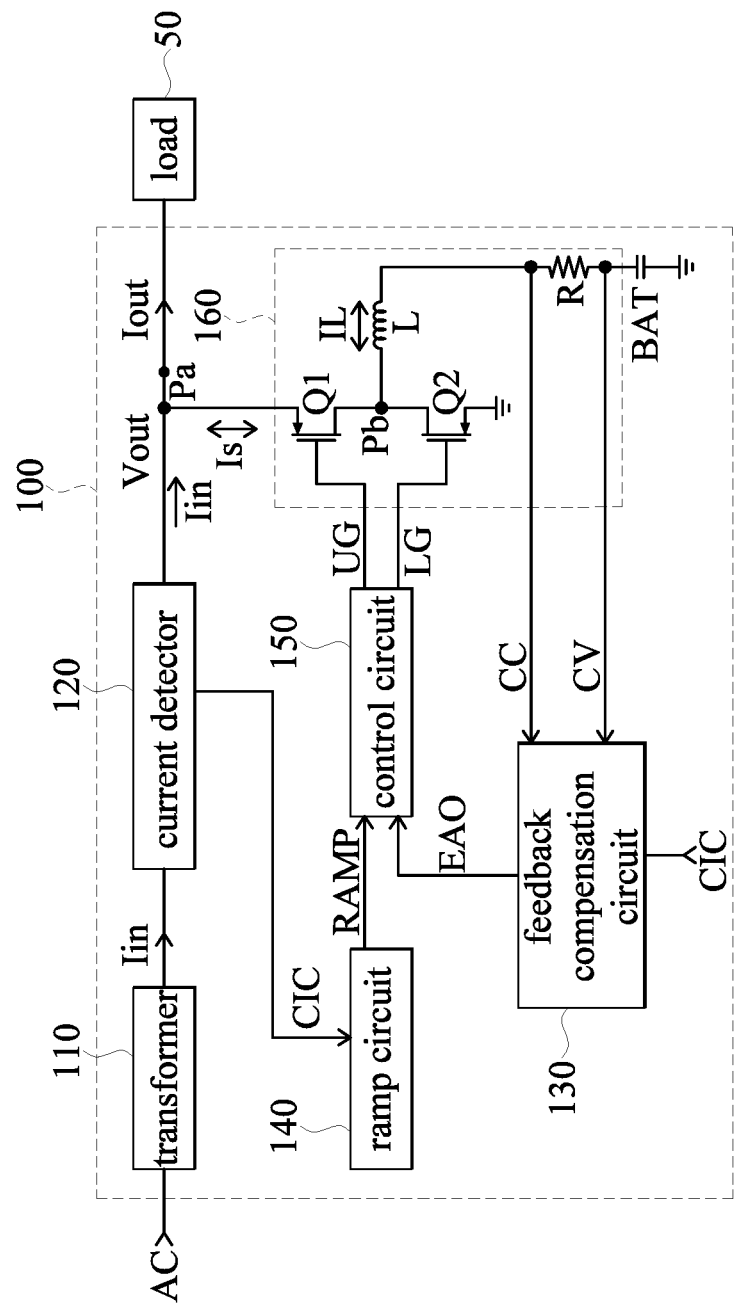
FIG. 1 is a schematic diagram of a charger according to an embodiment of the present invention.

Reference is first made to FIG. 1, a schematic diagram of a charger according to an embodiment of the present invention is shown. A charger 100 may be an energy storage element BAT, which receives a commercial power AC inputted from outside and converts the commercial power AC into an electrical energy and stores the electrical energy therein. Alternatively, the charger 100 may provide the electrical energy to a load 50. In the embodiment, the energy storage element BAT such as a battery can store the received energy or convert the energy stored therein into an electrical energy available for the load 50. The load 50 is, for example, an electronic device such as a mobile phone, a tablet computer, a music player, or a video player, the present invention is not limited thereto.

As shown in FIG. 1, the charger 100 converts the commercial power AC into an input current Iin and is operated in a buck mode or a turbo boost mode according to a current operating condition of the charger 100 to charge the energy storage element BAT or the load 50. Further, when the charger 100 is operated in the buck mode, the charger 100 supplies the energy to the load 50 and the internal energy storage element BAT based on the input current Iin at the same time. If the energy storage element BAT cannot store more energy, the charger 100 only charges the load 50. Furthermore, when the charger 100 is operated in the turbo boost mode, the charger 100 supplies the input current Iin to the load 50, and the energy storage element BAT also supplies the energy to the load 50 to satisfy the energy requirement of the load 50.

The charger 100 includes a transformer 110, a current detector 120, a feedback compensation circuit 130, a ramp circuit 140, a control circuit 150, and a power stage circuit 160. The transformer 110 includes appropriate logics, circuits, and/or codes, which are configured to receive the commercial power AC and to raise or reduce the commercial power AC to generate the input current Iin based on Faraday's law of electromagnetic induction. The current detector 120 is coupled to the transformer 110 and detects the input current Iin to generate an input current reference signal CIC indicating the input current Iin.

One terminal of the power stage circuit 160 is coupled to the transformer 110 and the load 50, and another terminal of the power stage circuit 160 is coupled to the energy storage element BAT, such that the power stage circuit 160 may transmit the energy of the energy storage element BAT to the load 50 or transmit the energy of the input current Iin to the energy storage element BAT. In the embodiment, the power stage circuit 160 includes a first switch Q1, a second switch Q2, an inductor L, and a resistance R. One terminal of the first switch Q1 is electrically connected to a point Pa between the current detector 120 and the load 50. The other terminal of the first switch Q1 is electrically connected to one terminal of the second switch Q2, and the other terminal of the second switch Q2 is grounded. A controlled terminal of the first switch Q1 and a controlled terminal of the second switch Q2 are controlled by the control circuit 150. One terminal of the inductor L is electrically connected to a point Pb between the first switch Q1 and the second switch Q2, and the other terminal of the inductor L is electrically connected to the energy storage element BAT through the resistance R. In the embodiment, the first switch Q1 is a p-channel metal-oxide-semiconductor (PMOS) transistor, and the second switch Q2 is an n-channel metal-oxide-semiconductor (NMOS) transistor, but the present invention is not limited thereto. In other embodiments, the first switch Q1 and the second switch Q2 may be other combinations of the PMOS and NMOS transistors.

Further, the operations of the first switch Q1 and the second switch Q2 are associated with a magnitude of an inductor current IL flowing through the inductor L. That is, the control circuit 150 turns on or turns off the first switch Q1 and the second switch Q2 to control a current Is flowing toward the energy storage element BAT or control the current Is supplied through the output stage circuit 160 from the energy storage element BAT.

The feedback compensation circuit 130 is coupled between the current detector 120 and the power stage circuit 160. The power stage circuit 160 detects a charging current CC and a charging voltage CV of the energy storage element BAT. Then, the feedback compensation circuit 130 generates an amplified error signal EAO according to the charging current CC, the charging voltage CV and the input current reference signal CIC. Further, the feedback compensation circuit 130 includes a feedback selector and a compensator (not shown in the drawings), the feedback selector detects both terminals of the resistance R to obtain the current charging current CC and the current charging voltage CV of the energy storage element BAT respectively. The compensator generates the amplified error signal EAO according to the detected charging current CC, charging voltage CV and input current reference signal CIC. The implementation of the feedback selector and the compensator is known to those of ordinary skill in the art, and thus will not be described herein.

Figure 2:
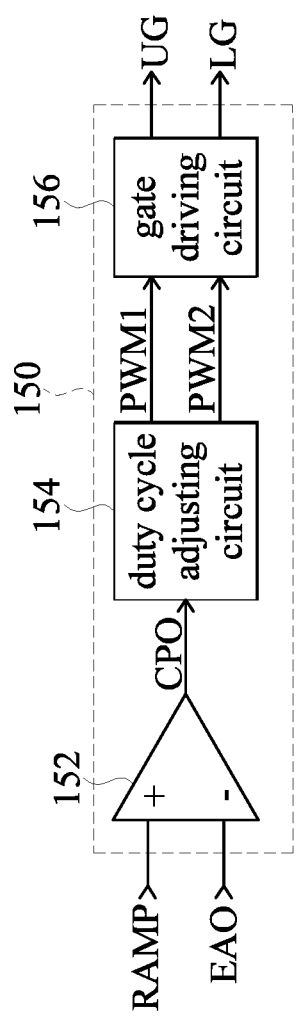
FIG. 2 is a schematic diagram of a control circuit according to an embodiment of the present invention.

The ramp circuit 140 is coupled to the current detector 120 and generates a ramp signal RAMP. The control circuit 150 is coupled between the ramp circuit 140, the feedback compensation circuit 130, and the power stage circuit 160 and controls the power stage circuit 160 according to the ramp signal RAMP and the amplified error signal EAO. Further, referring to FIG. 2, in the embodiment, the control circuit 150 includes a comparator 152, a duty cycle adjusting circuit 154, and a gate driving circuit 156. The comparator 152 compares the ramp signal RAMP with the amplified error signal EAO and accordingly generates a comparison result CPO. The duty cycle adjusting circuit 154 generates a duty cycle of the first pulse width modulated signal PWM1 and a duty cycle of the second pulse width modulated signal PWM2 to be transmitted to the gate driving circuit 156 according to the comparison result CPO. The gate driving circuit 156 generates a corresponding upper-bridge signal UG and a corresponding lower-bridge signal LG respectively according to the first pulse width modulated signal PWM1 and the second pulse width modulated signal PWM2 to control turning on and off of the first switch Q1 and the second switch Q2 respectively.

Figure 3A:
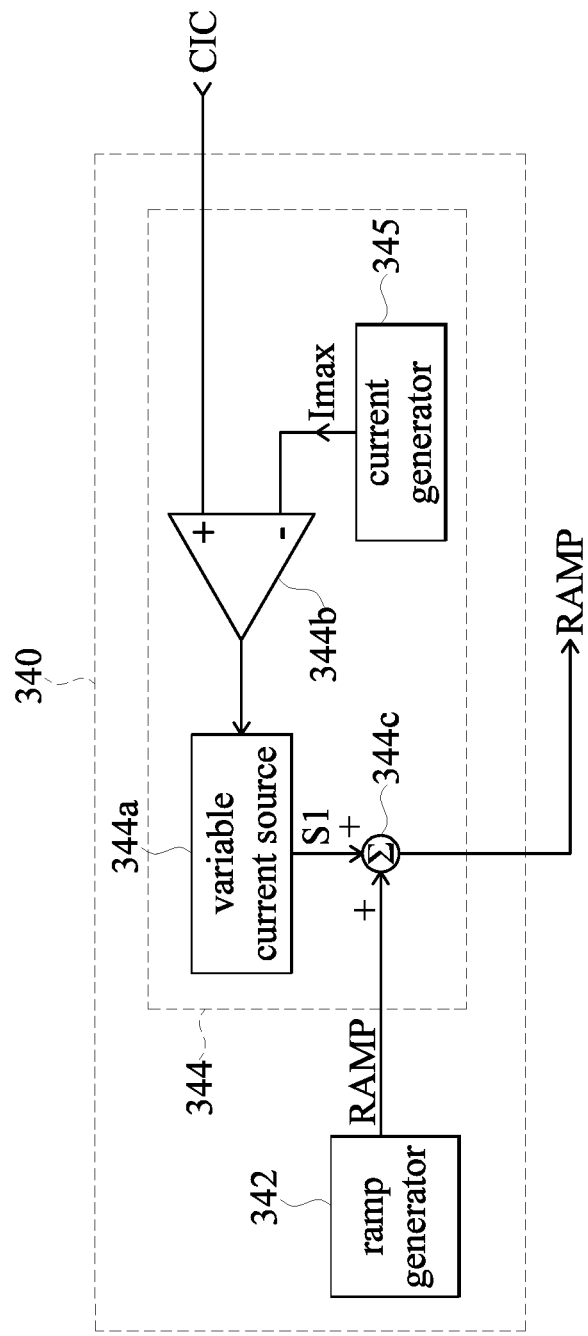
FIG. 3A is a schematic diagram of a ramp circuit according to an embodiment of the present invention.

Referring to FIG. 1 again, it is worth noting that one of the ramp circuit 140 and the feedback compensation circuit 130 adjusts the corresponding ramp signal RAMP or amplified error signal EAO according to the input current reference signal CIC, thereby achieving the fast transient response. As shown in FIG. 3A, the ramp circuit 340 includes a ramp generator 342 and a ramp regulator 344. The ramp generator 342 is configured to generate the ramp signal RAMP. The ramp adjuster 344 is coupled between the ramp generator 342 and the current detector 120 and has a maximum safe current Imax that the transformer 110 can supply. The ramp adjuster 344 determines whether the input current reference signal CIC is larger than or equal to the maximum safe current Imax. When the input current reference signal CIC is larger than or equal to the maximum safe current Imax, the ramp adjuster 344 raises the ramp signal RAMP. On the contrary, when the input current reference signal CIC is smaller than the maximum safe current Imax, the ramp signal RAMP is not raised by the ramp regulator 344 (that is, the ramp signal RAMP generated by the ramp generator 342 is remained).

Further, the ramp regulator 344 includes a variable current source 344a, a comparator 344b, and an adder 344c. The comparator 344b has a positive terminal and a negative terminal. The positive terminal receives the input current reference signal CIC and the negative terminal receives the maximum safe current Imax generated by the current generator 345. The comparator 344b controls the variable current source 344a to generate a current signal S1 according to the input current reference signal CIC and the maximum safe current Imax. The adder 344c is coupled to the variable current source 344a and the ramp generator 342 and adds up the ramp signal RAMP and the current signal S1.

When the input current reference signal CIC is larger than or equal to the maximum safe current Imax, the comparator 344b controls the variable current source 344a to generate a current signal S1 indicating a positive value. At this time, the adder 344c adds up the ramp signal RAMP and the current signal S1 to raise the ramp signal RAMP. In contrast, when the input current reference signal CIC is smaller than the maximum safe current Imax, the comparator 344b controls the variable current source 344a to generate the current signal S1 indicating 0. At this time, the ramp signal RAMP is not adjusted by the adder 344c.

Figure 3B:
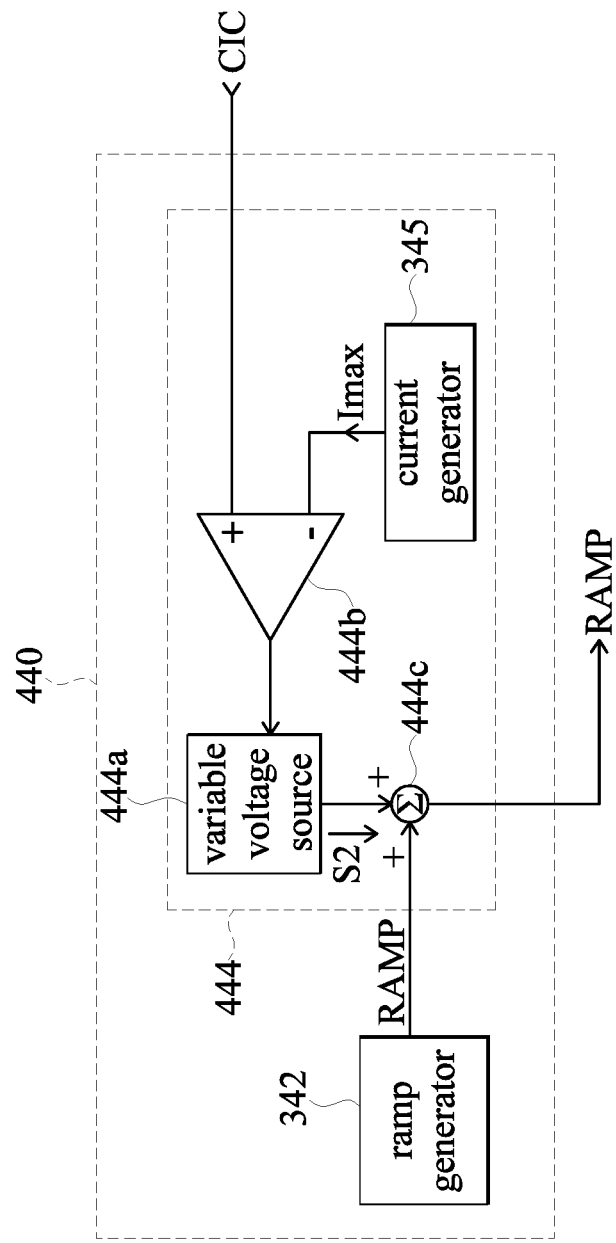
FIG. 3B is a schematic diagram of a ramp circuit according to another embodiment of the present invention.

In other embodiments, the variable current source 344a may also be a variable voltage source 444a. As shown in FIG. 3B, in the ramp circuit 440, the ramp regulator 444 includes the variable voltage source 444a, a comparator 444b and an adder 444c. The comparator 444b controls the variable voltage source 444a to generate a voltage signal S2 according to the input current reference signal CIC and the maximum safe current Imax. The adder 444c is coupled to the variable current source 444a and the ramp generator 342 and adds up the ramp signal RAMP and the voltage signal S2.

The comparator 444b controls the variable voltage source 444a to generate the voltage signal S2 indicating a positive value when the input current reference signal CIC is larger than or equal to the maximum safe current Imax. At this time, the adder 444c adds up the ramp signal RAMP and the voltage signal S2 to raise the ramp signal RAMP. The comparator 444b controls the variable voltage source 444a to generate the voltage signal S2 indicating 0 when the input current reference signal CIC is smaller than the maximum safe current Imax. At this time, the ramp signal RAMP is not adjusted by the adder 444c.

In the embodiments of FIGS. 3A and 3B, it is worth noting that if the corresponding ramp signal RAMP is adjusted according to the input current reference signal CIC by the ramp circuit 140, the corresponding amplified error signal EAO does not need to be adjusted according to the input current reference signal CIC by the feedback compensation circuit 130. In contrast, if the corresponding amplified error signal EAO is adjusted according to the input current reference signal CIC by the feedback compensation circuit 130, the corresponding ramp signal RAMP does not need to be adjusted according to the input current reference signal CIC adjusted by the ramp circuit 140. The following describes how the feedback compensation circuit 130 adjusts the corresponding amplified error signal EAO.

Figure 4A:
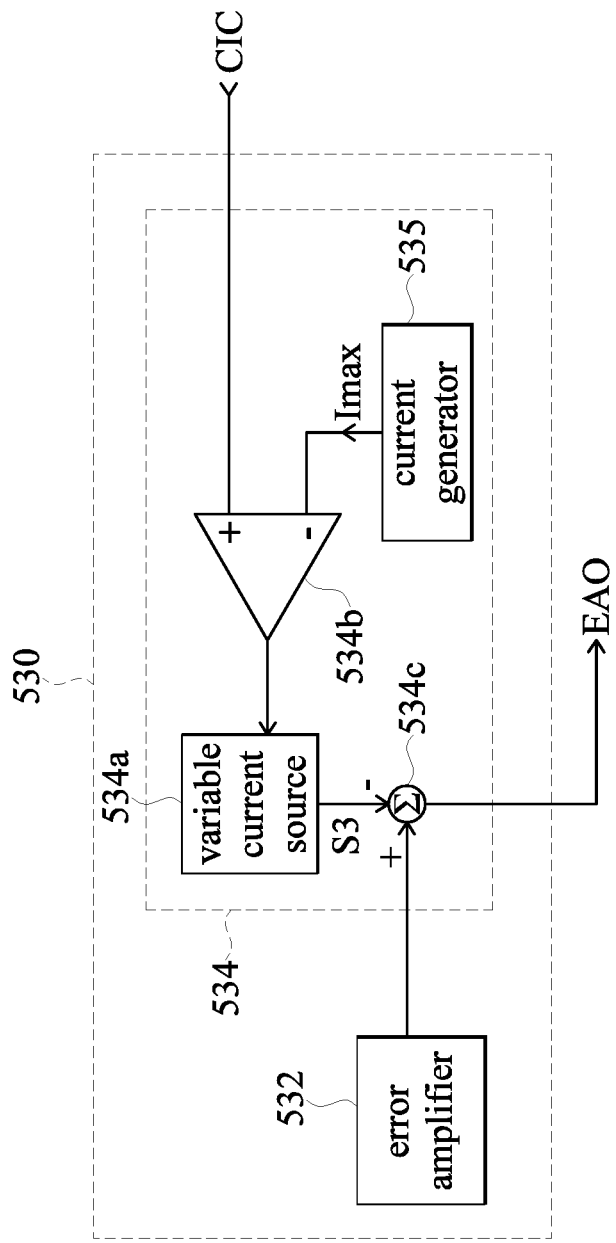
FIG. 4A is a schematic diagram of a feedback compensation circuit according to another embodiment of the present invention.

As shown in FIG. 4A, a feedback compensation circuit 530 includes an error amplifier 532 and an amplified error adjuster 534. The error amplifier 532 generates the error amplified signal EAO. The amplified error adjuster 534 is coupled between the error amplifier 532 and the current detector 110 and has the maximum safe current Imax that the transformer 110 can supply. The amplified error adjuster 534 determines whether the input current reference signal CIC is larger than or equal to the maximum safe current Imax. The amplified error adjuster 534 reduces the amplified error signal EAO when the input current reference signal CIC is larger than or equal to the maximum safe current Imax. On the contrary, the amplified error signal EAO is not reduced by the amplified error adjuster 534 (that is, the amplified error signal EAO generated by the error amplifier 532 is remained) when the input current reference signal CIC is smaller than the maximum safe current Imax.

Further, the amplified error adjuster 534 includes a variable current source 534a, a comparator 534b and an adder 534c. The comparator 534b has a positive terminal and a negative terminal. The positive terminal receives the input current reference signal CIC and the negative terminal receives the maximum safe current Imax generated by the current generator 535. The comparator 534b controls the variable current source 534a to generate a current signal S3 according to the input current reference signal CIC and the maximum safe current Imax. The adder 534c is coupled to the variable current source 534a and the error amplifier 532, and adds up the amplified error signal EAO and the current signal S3.

The comparator 534b controls the variable current source 534a to generate the current signal S3 indicating a negative value when the input current reference signal CIC is larger than or equal to the maximum safe current Imax. At this time, the adder 534c adds up the amplified error signal EAO and the current signal S3 to reduce the amplified error signal EAO. The comparator 534b controls the variable current source 534a to generate the current signal S1 indicating 0 when the input current reference signal CIC is smaller than the maximum safe current Imax. At this time, the amplified error signal EAO is not adjusted by the adder 534c.

Figure 4B:
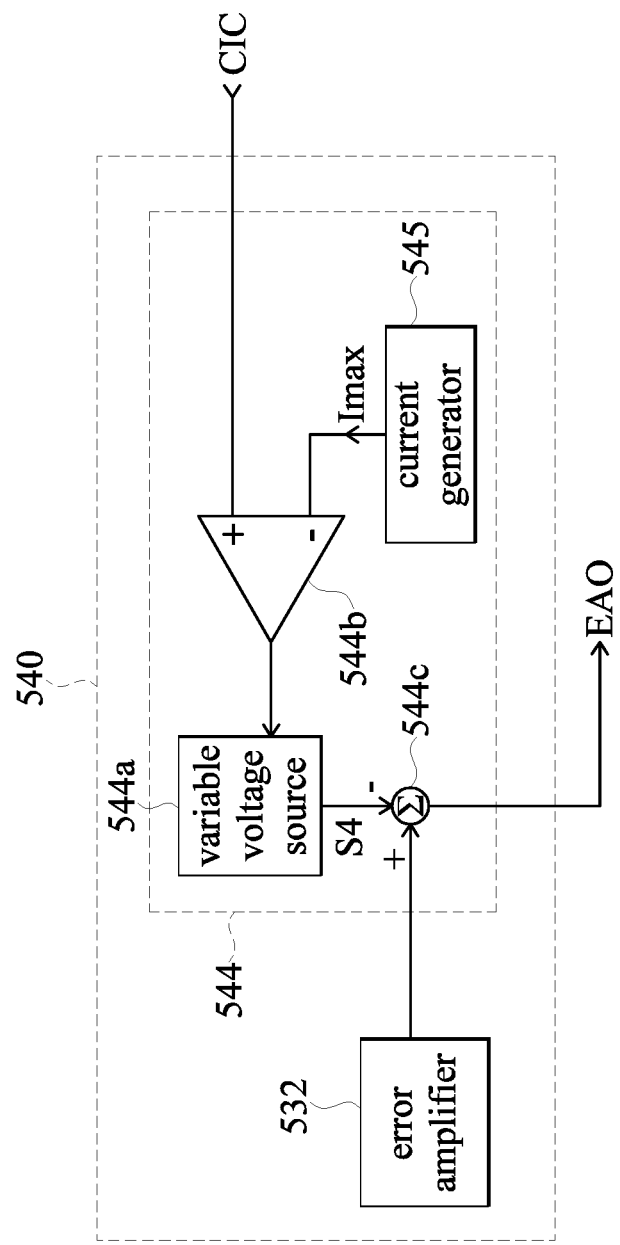
FIG. 4B is a schematic diagram of a feedback compensation circuit according to another embodiment of the present invention.

In other embodiments, the variable current source 534a may also be a variable voltage source 544a. As shown in FIG. 4B, in the ramp circuit 540, the amplified error regulator 544 includes the variable voltage source 544a, a comparator 544b and an adder 544c. The comparator 544b controls the variable voltage source 544a to generate a current signal S4 according to the input current reference signal CIC and the maximum safe current Imax generated by a current generator 545. The adder 544c is coupled to the variable voltage source 544a and the error amplifier 532, and adds up the amplified error signal EAO and the current signal S4.

The comparator 544b controls the variable voltage source 544a to generate a voltage signal S4 indicating a negative value when the input current reference signal CIC is larger than or equal to the maximum safe current Imax. At this time, the adder 544c adds up the amplified error signal EAO and the voltage signal S4 to reduce the amplified error signal EAO. The comparator 544b controls the variable voltage source 544a to generate a voltage signal S4 indicating 0 when the input current reference signal CIC is smaller than the maximum safe current Imax. At this time, the amplified error signal EAO is not adjusted by the adder 544c.

Therefore, referring to FIG. 1 again, when the input current reference signal CIC is larger than or equal to the maximum safe current Imax of the transformer 110, the ramp circuit 140 raises the ramp signal RAMP or the feedback compensation circuit 130 reduces the amplified error signal EAO. At this time, the control circuit 150 controls the power stage circuit 160 to stop the input current Iin charging the energy storage element BAT and controls the energy storage element BAT to charge the load 50 (that is, the energy storage element BAT rapidly charges the load 50 by the reverse current Is). On the contrary, when the input current reference signal CIC is smaller than the maximum safe current Imax, the ramp signal RAMP is not adjusted by the ramp circuit 140 and the amplified error signal EAO is not adjusted by the feedback compensation circuit 130. At this time, the control circuit 150 controls the power stage circuit 160 to transmit the input current Iin to the load 50 and the energy storage element BAT.

The operating principle of the charger 100 is further described below. In the embodiment, the ramp circuit 140 adjusts the corresponding ramp signal RAMP according to the input current reference signal CIC, but the feedback compensation circuit 130 does not adjust the corresponding amplified error signal EAO according to the input current reference signal CIC.

Figure 5:
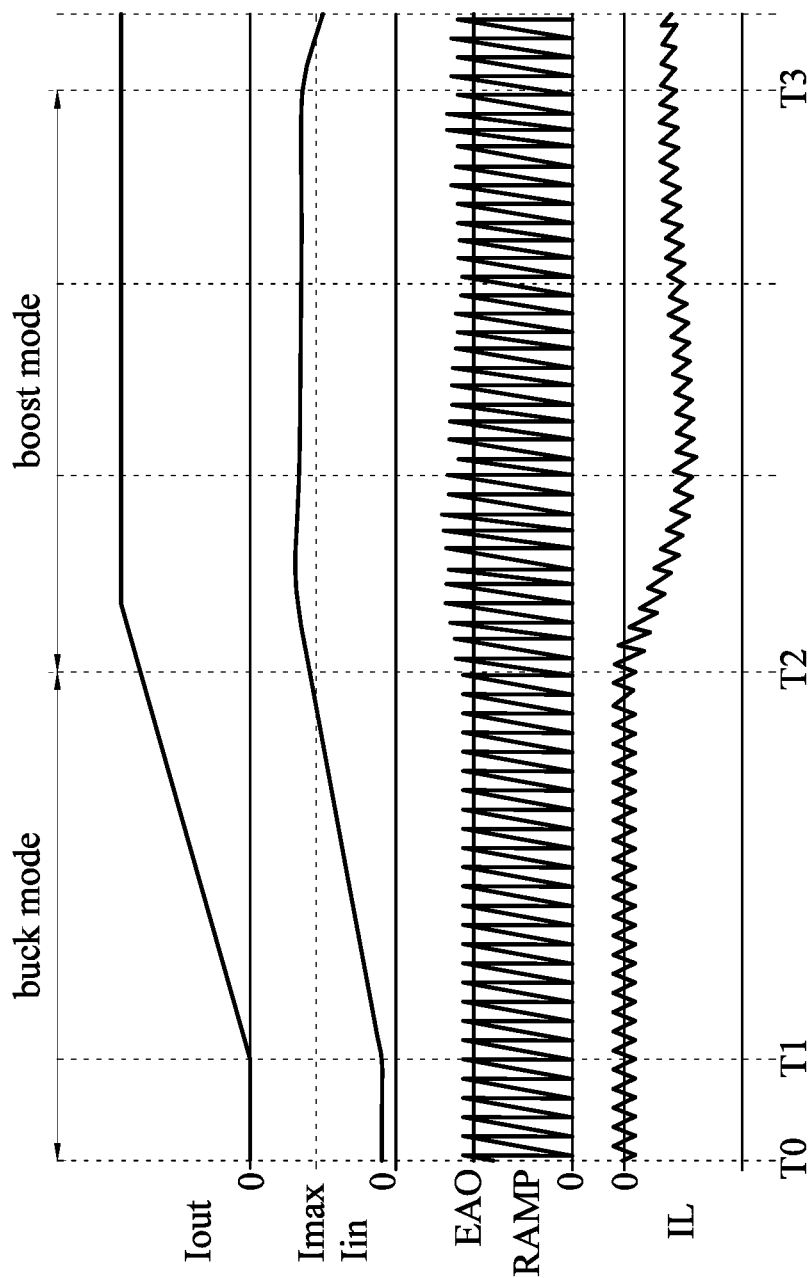
FIG. 5 is a waveform diagram of a charger operating in a buck mode and a turbo boost mode according to an embodiment of the present invention.

Referring to FIGS. 1 and 5, FIG. 5 is a waveform diagram of a charger operating in the buck mode and the turbo boost mode according to an embodiment of the present invention. As shown in FIG. 5, at a time T0, the charger 100 is connected to a device such as a socket that supplies the commercial power AC, and the charger 100 enters the buck mode. After receiving the commercial power AC, the transformer 110 starts to supply the input current Iin to charge the energy storage element BAT.

The control circuit 150 controls duty cycles of the first switch Q1 and the second switch Q2 according to the upper-bridge signal UG and the lower-bridge signal LG so as to adjust the inductor current IL flowing through the inductor L. That is, the control circuit 150 realizes the buck function by controlling turning on and off of the first switch Q1 and the second switch Q2 to charge the energy storage element BAT.

At a time T1, the charger 100 is connected to the load 50, and the transformer 110 starts to supply the input current Iin to the load 50 to charge the load 50. When the energy storage element BAT is already filled with energy, the control circuit 150 turns off the first switch Q1 and the second switch Q2 to stop charging the energy storage element BAT. At this time, all the input current Iin supplied by the transformer 110 flows to the load 50.

The input current Iin supplied by the transformer 110 is increased with an increase of the output current Iout required by the load 50. The transformer 110 can afford the energy required by the load 50 without using the energy storage element BAT as long as the output current Tout required by the load 50 does not exceed the maximum safe current Imax that the transformer 110 can supply. The maximum safe current Imax is a maximum input current which the transformer 110 can supply without being damaged Since the input reference current CIC does not exceed the maximum safe current Imax (that is, the input current reference signal CIC indicating the input current Iin is smaller than the maximum safe current Imax), the ramp signal RAMP is not adjusted by the ramp circuit 140 and the amplified error signal EAO is not adjusted by the feedback compensation circuit 130. Therefore, the ramp signal RAMP and the amplified error signal EAO can remain stable during this time interval. The control circuit 150 controls turning on and off of the first switch Q1 and the second switch Q2 according to the amplified error signal EAO and the ramp signal RAMP.

When the first switch Q1 is turned on and the second switch Q2 is turned off, a potential at the terminal Pb is equal to a potential at a source of the first switch Q1. Therefore, the inductor current IL flowing through the inductor L has a positive slope. When the first switch Q1 is turned off and the second switch Q2 is turned on, the potential at the terminal Pb is equal to a potential at a source of the second switch Q2. Therefore, the inductor current IL flowing through the inductor L has a negative slope. With the above, the inductor current IL exhibits a zigzag waveform as shown in FIG. 5.

At a time T2, the ramp circuit 140 and the feedback compensation circuit 130 determine that the input current reference signal CIC is larger than or equal to the maximum safe current Imax (that is, the input current Iin supplied by the transformer 110 has exceeded the maximum safe current Imax that the transformer 11 can supply), meaning that the transformer 110 alone cannot supply the output current Tout required by the load 50, and the charger 100 enters the turbo boost mode. The energy storage element BAT must rapidly supply the energy required by the load 50 to prevent the transformer 110 from being damaged by the excessive energy.

At this time, the ramp signal RAMP is raised by the ramp circuit 140. Further, the ramp circuit 140 determines how much ramp signal RAMP is to be raised based on a degree by which the input current reference signal CIC is larger than the maximum safe current Imax. The control circuit 150 adjusts the duty cycle of the first pulse width modulated signal PWM1 and the duty cycle of the second pulse width modulated signal PWM2 according to the amplified error signal EAO and the ramp signal RAMP, such that the current of the inductor L gradually approaches the negative value. At this time, the energy storage element BAT generates a greater current Is through the output stage circuit 160 to the load 50.

As the energy storage element BAT assists the transformer 110 more quickly in supplying the power to the load 50, the input current Iin supplied by the transformer 110 is reduced more quickly. At a time T3, the input current Iin supplied by the transformer 110 is reduced to less than the maximum safe current Imax to prevent the transformer 110 from being damaged. If the input current Iin is reduced to less than the maximum safe current Imax again, the charger 100 enters the buck mode again and the above steps would be repeated. At this time, the input current Iin supplied by the transformer 110 can supply the sufficient energy to the load 50.

Figure 6:
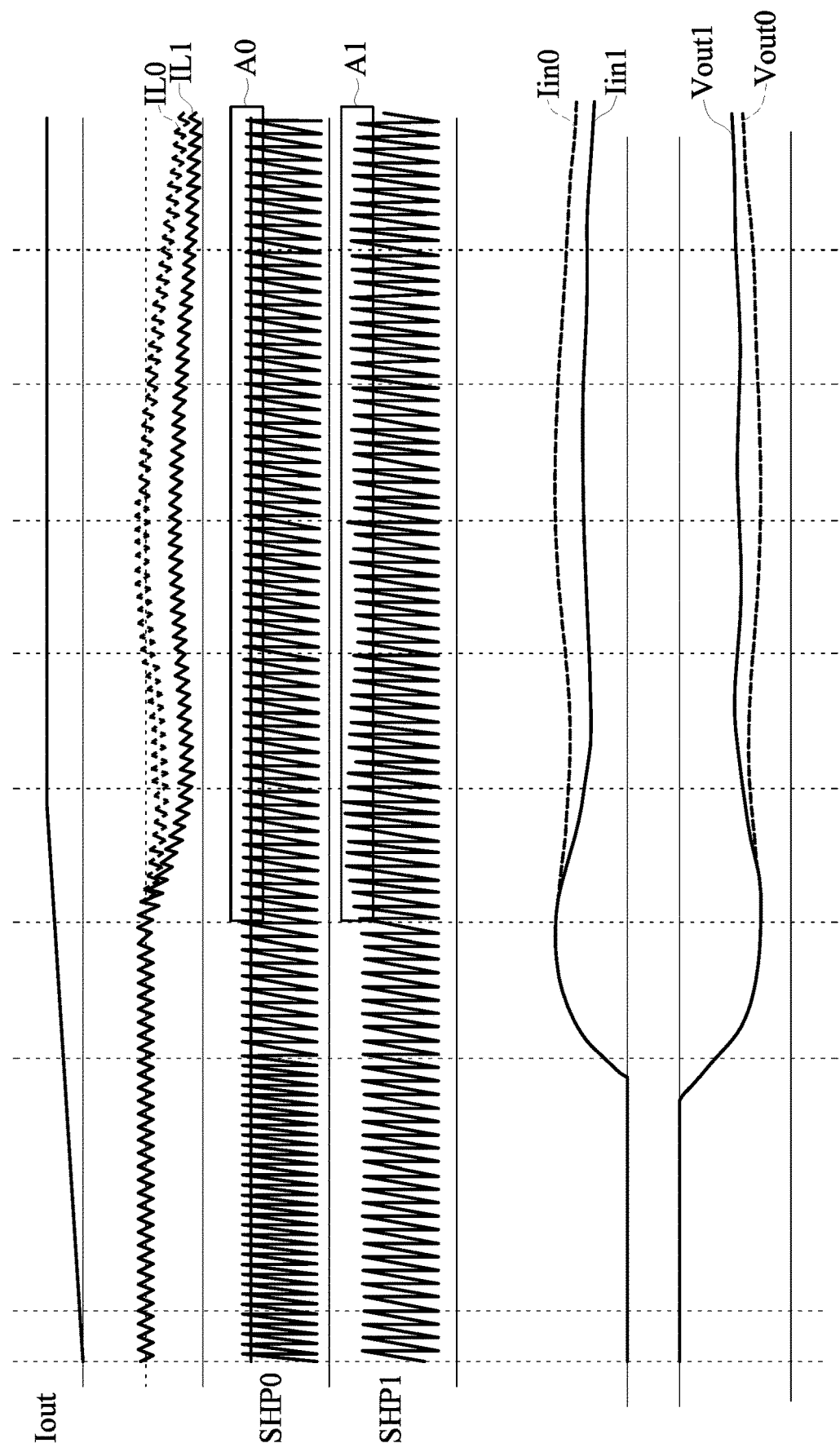
FIG. 6 is a signal waveform diagram of a method of controlling different ramp circuits and feedback compensation circuits when a charger operating in the turbo charger boost mode.

The following will further compare differences between implementations where the ramp signal RAMP is adjusted by the ramp circuit 140 and the amplified error signal EAO is not adjusted by the feedback compensation circuit 130, and where the ramp signal RAMP is not adjusted by the ramp circuit 140 and the amplified error signal EAO is adjusted by the feedback compensation circuit 130. Reference is made to FIG. 6, the charger 100 is operated in the turbo boost mode. For ease of illustration, the waveform of the unadjusted ramp signal RAMP and the unadjusted amplified error signal EAO is referred to as an unadjusted waveform SHP0, a corresponding inductor current is represented by IL0, a corresponding input current is represented by Iin0, and a corresponding output voltage is represented by Vout0 (as shown by dotted lines in FIG. 6). The waveform of the adjusted ramp signal RAMP and the unadjusted amplified error signal EAO is referred to as an adjusted waveform SHP1, a corresponding inductor current is represented by IL1, a corresponding input current is represented by Iin1, and a corresponding output voltage is represented by Vout1 (as shown by solid lines in FIG. 6).

Therefore, after a time T4, the ramp signal RAMP of the adjusted waveform SHP1 (such as a marked portion A1 shown in FIG. 6) is raised, but the ramp signal RAMP of the unadjusted waveform SHP0 (such as a marked portion A0 shown in FIG. 6) is not raised, such that the inductor current IL1 drops more than the inductor current IL0. The larger the magnitude of drop in the inductor current IL1 is, the larger the charging current Is supplied to the load 50 from the energy storage element BAT is, so as to allow the input current Iin1 to decrease more.

Therefore, the ramp circuit 140 may determine how much the ramp signal RAMP should be raised according to a degree by which the input current reference signal CIC associated with the input current Iin1 is larger than the maximum safe current Imax, such that the inductor current IL1 gradually approaches the negative value. At this time, the energy storage element BAT generates a larger charging current Is through the output stage circuit 160 to the load 50, and the input current Iin supplied by the transformer 110 decreases more quickly, thereby preventing the transformer 110 from being damaged by an excessive input current IL1. At the same time, the output voltage Vout1 can stabilize more quickly than the output voltage Vout0.

Based on the above, in the embodiments of the present invention, the charger 100 may be operated in the buck mode and the boost mode to achieve the functions of controlling the boost circuit and the buck circuit of the charger. In addition, the reaction time of the charger 100 provided by the embodiments of the present invention is relatively faster and more stable. The reason is that the processor of the conventional charger spends more time to output the corresponding control signals to control switching between the boost circuit and the buck circuit. Therefore, the conventional energy storage element cannot rapidly respond to the output current requirement of the load so that the voltage of the electronic device drops.

Figure 7:
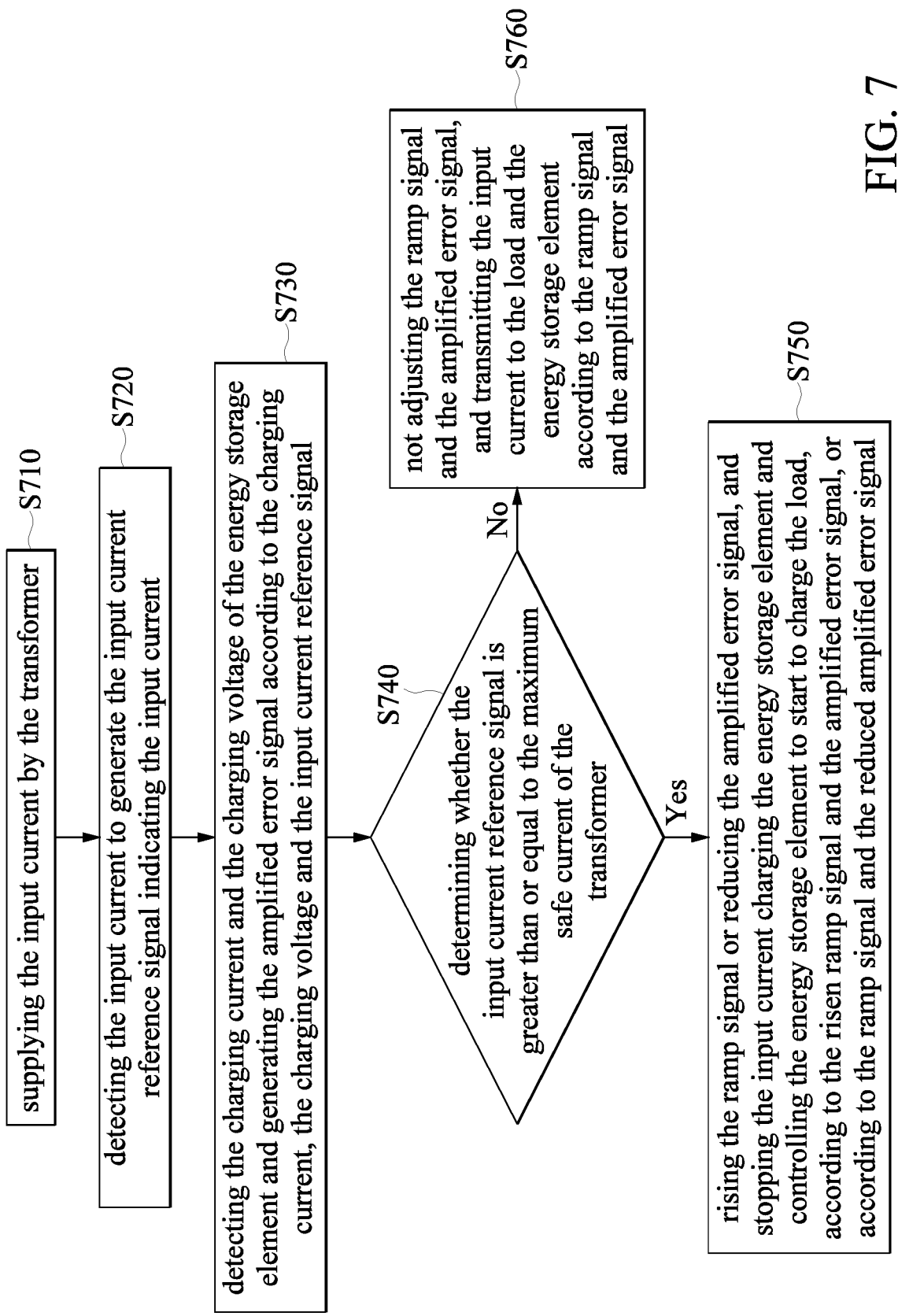
FIG. 7 is a flowchart of a method of controlling a charger according to an embodiment of the present invention.

As described in the above embodiments, the present invention can be summarized as the control method applicable to the above charger 100 having the fast transient response. Referring to FIGS. 7 and 1, the transformer 110 of the charger 100 receives the commercial power AC and then starts to supply the input current Iin (step S710). The charger 100 then detects the input current Iin to generate the input current reference signal CIC indicating the input current Iin (step S720). The charger 100 further detects the charging current CC, the charging voltage CV and the input current reference signal CIC of the energy storage element BAT, and generates the amplified error signal EAO according to the charging current CC, the charging voltage CV and the input current reference signal CIC (step S730).

The charger 100 then determines whether the input current reference signal CIC is larger than or equal to the maximum safe current Imax of the transformer 110, and accordingly determines whether to adjust the ramp signal RAMP or the amplified error signal EAO (step S740).

When the input current reference signal CIC is larger than or equal to the maximum safe current Imax, it represents that the input current Iin supplied by the transformer 110 has exceeded the maximum safe current Imax that the transformer 110 can supply. At this time, the charger 100 is operated in the turbo boost mode. The charger 100 raises the ramp signal RAMP or reduces the amplified error signal EAO, and according to the raised ramp signal RAMP and the amplified error signal EAO, stops the input current Iin charging the energy storage element BAT and starts the energy storage element BAT to charge the load 50 (namely, the energy storage element BAT more quickly charges the load 50 by the reverse current Is) (step S750).

In contrast, when the input current reference signal CIC is less than the maximum safe current Imax, the input current Iin supplied by the transformer 110 does not exceed the maximum safe current Imax that the transformer 110 can supply. At this time, the charger 100 is operated in the buck mode. The charger 100 does not adjust the ramp signal RAMP and the amplified error signal EAO, and transmits the input current Iin to the load 50 and the energy storage element BAT according to the ramp signal RAMP and the amplified error signal EAO (step S760).

In summary, the embodiments of the present invention provides the charger having the fast transient response and the control method thereof, which decide how to quickly respond to the load requirement by determining whether the input current reference signal indicating the input current is larger than or equal to the maximum safe current of the transformer. Therefore, the charger and the control method of these embodiments realize the fast transient response without having to control switching between the boost circuit and the buck circuit. Meanwhile, the charger and the control method thereof cannot be damaged by the excessive current input and can stabilize the output voltage of the load more quickly.

The above description is only embodiments of the present invention, and it is not intended to limit the scope of the present invention.

What is claimed is:

1. A charger having a fast transient response, the charger comprising:
    a transformer configured to supply an input current;
    a current detector coupled to the transformer and configured to detect the input current to generate an input current reference signal indicating the input current;
    a power stage circuit having one terminal coupled to the transformer and a load and another terminal coupled to an energy storage element;
    a feedback compensation circuit coupled between the current detector and the power stage circuit, the power stage circuit is configured to detect a charging current and a charging voltage of the energy storage element, and the feedback compensation circuit is configured to generate an amplified error signal according to the charging current, the charging voltage and the input current reference signal;
    a ramp circuit coupled to the current detector and configured to generate a ramp signal; and
    a control circuit coupled between the ramp circuit, the feedback compensation circuit and the power stage circuit, and the control circuit is configured to control the power stage circuit according to the ramp signal and the amplified error signal;
    wherein when the input current reference signal is larger than or equal to a maximum safe current of the transformer, the ramp circuit raises the ramp signal or the feedback compensation circuit reduces the amplified error signal, and the control circuit accordingly controls the power stage circuit to stop the input current charging the energy storage element and starts the energy storage element to charge the load through the power stage circuit, and when the input current reference signal is smaller than the maximum safe current, the ramp signal and the amplified error signal are not adjusted by the ramp circuit and the feedback compensation circuit respectively, and the control circuit accordingly controls the power stage circuit to transmit the input current to the load and the energy storage element.

2. The charger having the fast transient response of claim 1, wherein the ramp circuit includes:
    a ramp generator configured to generate the ramp signal; and
    a ramp adjuster coupled between the ramp generator and the current detector and having the maximum safe current, and the ramp adjuster is configured to determine whether the input current reference signal is larger than or equal to the maximum safe current;
    wherein when the input current reference signal is larger than or equal to the maximum safe current, the ramp adjuster raises the ramp signal;
    wherein when the input current reference signal is smaller than the maximum safe current, the ramp signal is not raised by the ramp adjuster.

3. The charger having the fast transient response of claim 2, wherein the ramp adjuster includes:
    a variable current source;
    a comparator having a positive terminal and a negative terminal, the positive terminal receiving the input current reference signal and the negative terminal receiving the maximum safe current generated by a current generator, and the comparator being configured to control the variable current source to generate a current signal according to the input current reference signal and the maximum safe current; and an adder coupled to the variable current source and the ramp generator and configured to add up the ramp signal and the current signal;

wherein when the input current reference signal is larger than or equal to the maximum safe current, the comparator controls the variable current source to generate the current signal indicating a positive value;

wherein when the input current reference signal is smaller than the maximum safe current, the comparator controls the variable current source to generate the current signal indicating 0.

4. The charger having the fast transient response of claim 2, wherein the ramp adjuster includes:

a variable voltage source;

a comparator having a positive terminal and a negative terminal, the positive terminal receiving the input current reference signal and the negative terminal receiving the maximum safe current generated by a current generator, and the comparator being configured to control the variable voltage source to generate a voltage signal according to the input current reference signal and the maximum safe current; and an adder coupled to the variable voltage source and the ramp generator, and the adder is configured to add up the ramp signal and the voltage signal;

wherein when the input current reference signal is larger than or equal to the maximum safe current, the comparator controls the variable voltage source to generate the voltage signal indicating a positive value;

wherein when the input current reference signal is smaller than the maximum safe current, the comparator controls the variable voltage source to generate the voltage signal indicating 0.

5. The charger having the fast transient response of claim 1, wherein the feedback compensation circuit includes:

an error amplifier configured to generate the amplified error signal; and an amplified error adjuster coupled between the error amplifier and the current detector, the amplified error adjuster has the maximum safe current and is configured to determine whether the input current reference signal is larger than or equal to the maximum safe current;

wherein when the input current reference signal is larger than or equal to the maximum safe current, the amplified error regulator reduces the amplified error signal;

wherein when the input current reference signal is smaller than the maximum safe current, the amplified error signal is not reduced by the amplified error regulator.

6. The charger having the fast transient response of claim 5, wherein the amplified error adjuster includes:

a variable voltage source;

a comparator having a positive terminal and a negative terminal, the positive terminal receiving the input current reference signal and the negative terminal receiving the maximum safe current generated by a current generator, and the comparator being configured to control the variable current source to generate a current signal according to the input current reference signal and the maximum safe current; and an adder coupled to the variable current source and the error amplifier and configured to add up the amplified error signal and the current signal;

wherein when the input current reference signal is larger than or equal to the maximum safe current, the comparator is configured to control the variable current source to generate the current signal indicating a negative value;

wherein when the input current reference signal is larger than or equal to the maximum safe current, the comparator is configured to control the variable current source to generate the current signal indicating 0.

7. The charger having the fast transient response of claim 5, wherein the amplified error adjuster includes:

a variable voltage source;

a comparator having a positive terminal and a negative terminal, the positive terminal receiving the input current reference signal and the negative terminal receiving the maximum safe current generated by a current generator, and the comparator being configured to control the variable voltage source to generate a voltage signal according to the input current reference signal and the maximum safe current; and an adder coupled to the variable voltage source and the error amplifier and configured to add up the amplified error signal and the voltage signal;

wherein when the input current reference signal is larger than or equal to the maximum safe current, the comparator controls the variable voltage source to generate the voltage signal indicating a negative value;

wherein when the input current reference signal is smaller than the maximum safe current, the comparator controls the variable voltage source to generate the voltage signal indicating 0.

8. A method of controlling a charger, the charger being coupled to a load, the method comprising:

supplying an input current by a transformer;

detecting the input current to generate an input current reference signal indicating the input current;

detecting a charging current and a charging voltage of an energy storage element, generating an amplified error signal according to the charging current, the charging voltage, and the input current reference signal; and determining whether the input current reference signal is larger than or equal to a maximum safe current of the transformer;

wherein when the input current reference signal is larger than or equal to the maximum safe current, raising a ramp signal or reducing the amplified error signal, and stopping the input current charging the energy storage element and controlling the energy storage element to start to charge the load according to the raised ramp signal and the amplified error signal, or according to the ramp signal and the reduced amplified error signal;

wherein when the input current reference signal is smaller than the maximum safe current, transmitting the input current to the load and the energy storage element according to the ramp signal and the amplified error signal that are not adjusted.

9. The method of controlling charger of claim 8, wherein the step of raising the ramp signal further includes:

generating the ramp signal; and determining whether the input current reference signal is larger than or equal to the maximum safe current;

wherein when the input current reference signal is larger than or equal to the maximum safe current, rising the ramp signal;

wherein when the input current reference signal is smaller than the maximum safe current, the ramp signal is not raised.

10. The method of controlling charger of claim 8, wherein the step of reducing the amplified error signal further includes:
   generating the amplified error signal; and
   determining whether the input current reference signal is larger than or equal to the maximum safe current;
   wherein when the input current reference signal is larger than or equal to the maximum safe current, reducing the amplified error signal;
   wherein when the input current reference signal is smaller than the maximum safe current, the amplified error signal is not reduced.

* * * * *